(12) United States Patent
Hirano et al.

(10) Patent No.: US 8,502,602 B2
(45) Date of Patent: Aug. 6, 2013

(54) CLASS-D AMPLIFIER CIRCUIT

(75) Inventors: Katsuya Hirano, Hamamatsu (JP);
Hirotoshi Tsuchiya, Iwata (JP)

(73) Assignee: Yamaha Corporation, Hamamatsu-shi (JP)

( * ) Notice: Subject to any disclaimer, the term of this patent is extended or adjusted under 35 U.S.C. 154(b) by 27 days.

(21) Appl. No.: 13/330,019

(22) Filed: Dec. 19, 2011

(65) Prior Publication Data

US 2012/0154044 A1    Jun. 21, 2012

(30) Foreign Application Priority Data

Dec. 21, 2010  (JP) ................................. 2010-284721

(51) Int. Cl.
*H03F 3/217*    (2006.01)

(52) U.S. Cl.
USPC ......................... 330/251; 330/10; 330/207 A

(58) Field of Classification Search
USPC ..................... 330/251, 10, 207 A, 298, 207 P
See application file for complete search history.

(56) References Cited

U.S. PATENT DOCUMENTS

| 7,088,177 B2 * | 8/2006 | Lind .......................... 330/207 A |
| 2007/0103234 A1 | 5/2007 | Maejima et al. |
| 2009/0115514 A1 | 5/2009 | Maejima et al. |
| 2011/0221529 A1 | 9/2011 | Maejima |

FOREIGN PATENT DOCUMENTS

| JP | 2010-187399 A | 8/2010 |
| KR | 10-2006-0099095 B1 | 9/2006 |
| KR | 10-2007-0036008 A | 4/2007 |

OTHER PUBLICATIONS

Korean Office Action with English Translation dated Apr. 29, 2013 (seven (7) pages).

* cited by examiner

*Primary Examiner* — Hieu Nguyen
(74) *Attorney, Agent, or Firm* — Crowell & Moring LLP

(57) ABSTRACT

A class-D amplifier circuit includes an amplifier that generates pulse-width modulated output signals according to input signals which have phases reverse to each other and are supplied to a first input end and a second input end, a first transistor interposed between a first input path extending from the first input end to the amplifier and a second input path extending from the second input end to the amplifier, and a voltage applying circuit that applies a control voltage corresponding to a predetermined value to a control terminal of the first transistor so that a current flowing between both ends of the first transistor increases in accordance with increase of levels of the input signals within a range in which the levels of the input signals are higher than the predetermined value.

5 Claims, 6 Drawing Sheets

CLASS-D AMPLIFIER CIRCUIT

BACKGROUND

The present invention relates to a class-D amplifier circuit appropriate for a power amplifier of an audio apparatus and the like.

Technologies for preventing clipping of an output signal of a class-D amplifier circuit have been proposed. For example, JP-A-2010-187399 discloses a class-D amplifier circuit including a clipping prevention controller for controlling a switch interposed between input ends which receive two input signals having a normal phase and a reverse phase. The clipping prevention controller attenuates the input signals by controlling the switch such that the switch is turned on periodically and intermittently when clipping occurs.

However, in JP-A-2010-187399, even if the levels of the input signals decrease during an operation of the clipping prevention controller, attenuation of the input signals may not stop immediately such that the input signals having levels in an appropriate range in which clipping on output signals does not occur are attenuated. Moreover, even if the sound volume of the input signals is adjusted during the operation of the clipping prevention controller, actually, the sound volume of the output signals rarely changes.

SUMMARY

Considering the above-mentioned circumferences, an object of the present invention is to appropriately attenuate input signals according to levels and to certainly change the sound volume when the level is attenuated.

In order to achieve the object, according to the present invention, there is provided a class-D amplifier circuit comprising:

an amplifier that generates pulse-width modulated output signals according to input signals which have phases reverse to each other and are supplied to a first input end and a second input end;

a first transistor interposed between a first input path extending from the first input end to the amplifier and a second input path extending from the second input end to the amplifier; and a voltage applying circuit that applies a control voltage corresponding to a predetermined value to a control terminal of the first transistor so that a current flowing between both ends of the first transistor increases in accordance with increase of levels of the input signals within a range in which the levels of the input signals are higher than the predetermined value.

Preferably, the voltage applying circuit includes a current source which generates a current, a voltage source which generates a reference voltage, and a second transistor which is interposed in a diode connection state between the current source and the voltage source, and has a control terminal connected to the control terminal of the first transistor.

Preferably, the current source generates the current if occurrence of clipping of the output signals of the amplifier is detected, and stops generation of the current if the occurrence of clipping is not detected.

Preferably, the class-D amplifier circuit further includes a switch disposed in parallel with the first transistor and disposed between the first input path and the second input path, and a control circuit that controls the switch so that the switch is turned on intermittently so as to attenuate the input signals if occurrence of clipping of the output signal of the amplifier is detected.

Preferably, the class-D amplifier circuit further includes a first resistor interposed between the first input path and the first transistor, and a second resistor interposed between the second input path and the first transistor.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF EXEMPLARY EMBODIMENTS

Figure 1:
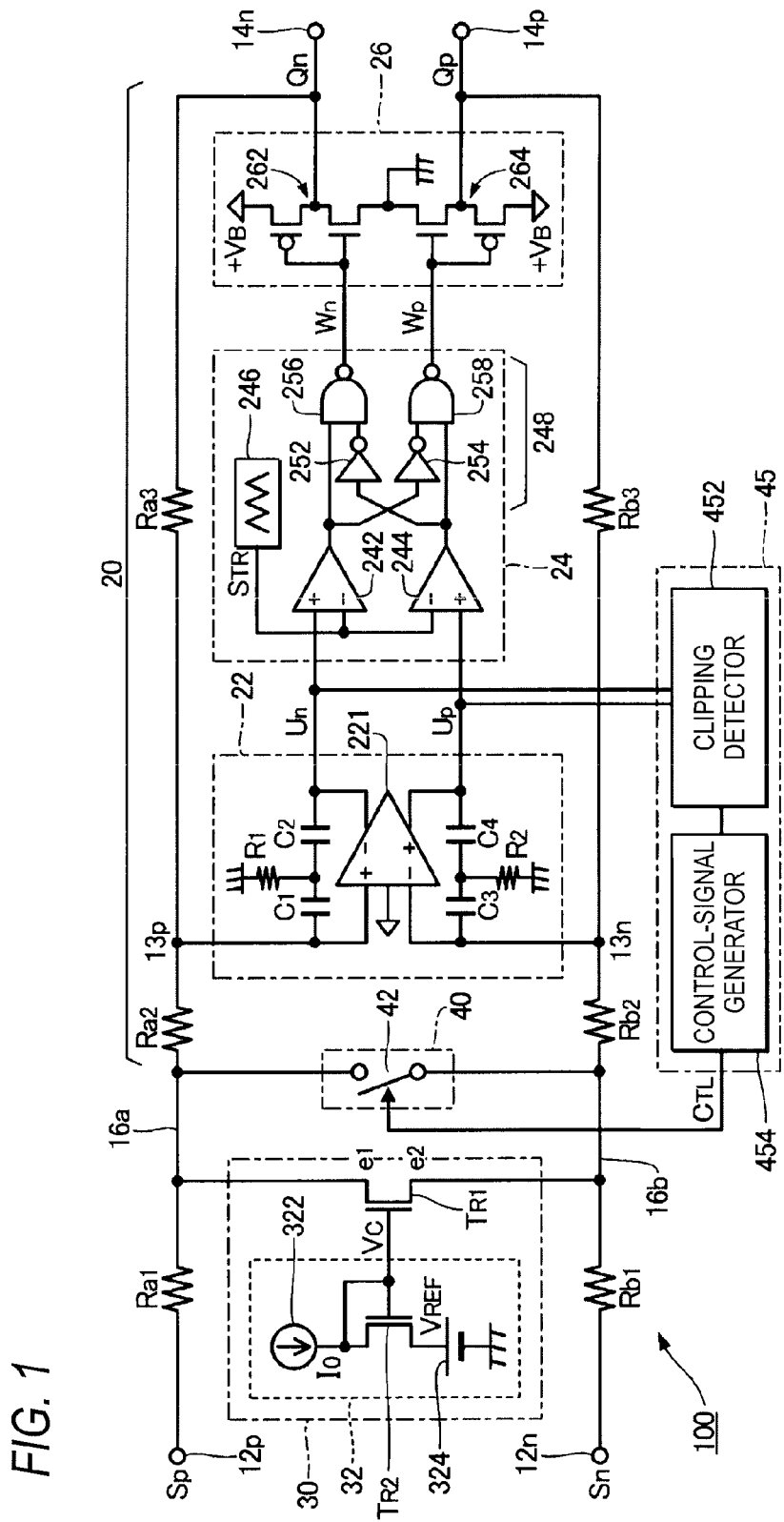
FIG. 1 is a circuit diagram of a class-D amplifier circuit according to an embodiment of the present invention.

FIG. 1 is a circuit diagram of a class-D amplifier circuit 100 according to an embodiment of the present invention. The class-D amplifier circuit 100 includes an amplifier 20, a first attenuator 30, a second attenuator 40, and a control circuit 45. The amplifier 20 generates two pulse-width modulated output signals Qp and Qn having a normal phase and a reverse phase, according to two input signals Sp and Sn which have a normal phase and a reverse phase and are supplied to the input ends 12p and 12n, respectively, and outputs the output signals Qp and Qn from output ends 14p and 14n, respectively. The input signals Sp and Sn are differential analog signals, and the output signals Qp and Qn are differential binary signals. Between the input end 12p and the output end 14n, resistors Ra1 Ra2, and Ra3 are interposed in series, and between the input end 12n and the output end 14p, resistors Rb1, Rb2, and Rb3 are interposed in series. A drive load (not shown) such as a speaker connected between the output ends 14p and 14n is driven by a differential signal of the output signals Qp and Qn.

The amplifier 20 includes an error integrator 22, a pulse width modulation (PWM) circuit 24, and an output buffer circuit 26. The normal-phase input signal Sp supplied to the input end 12p is supplied to a normal-phase-side input end 13p of the error integrator 22 through an input path 16a including the resistors Ra1 and Ra2. The reverse-phase input signal Sn supplied to the input end 12n is supplied to a reverse-phase-side input end 13n of the error integrator 22 through an input path 16b including the resistors Rb1 and Rb2. The reverse-phase output signal Qn is fed from the output end 14n back to the input end 13p of the error integrator 22 through the resistor Ra3. The normal-phase output signal Qp is fed from the output end 14p back to the input end 13n of the error integrator 22 through the resistor Rb3. The error integrator 22 generates two integrated-value signals Up and Un having a normal phase and a reverse phase according to the results of integration of errors of the input signals Sp and Sn and the output signals Qp and Qn. Although a specific configuration of the error integrator 22 is arbitrary, FIG. 1 illustrates a second-order integration circuit including an operational amplifier (fully-differential amplifier) 221, four capacitors C1 to C4, and two resistors R1 and R2.

The PWM circuit 24 of FIG. 1 generates two phase pulse Wp and Wn having pulse widths according to the levels of the integrated-value signals Up and Un generated by the error integrator 22. The PWM circuit 24 illustrated in FIG. 1 includes comparison circuits 242 and 244, a triangular-wave generator 246, and a logic circuit 248. The triangular-wave generator 246 generates a triangular-wave signal STR having a predetermined period. The comparison circuit 242 outputs a signal which is at a low level in periods when the level of the triangular-wave signal STR is higher than the integrated-value signal Un and is at a high level in the other periods. Similarly, the comparison circuit 244 outputs a signal which is at a low level in periods when the level of the triangular-wave signal STR is higher than the integrated-value signal Up and is at a high level in the other periods. The logic circuit 248 includes two inverters 252 and 254, and two NAND circuits 256 and 258. The NAND circuit 256 outputs a negative logical product of an inverted signal of the output of the comparison circuit 244 from the inverter 252 and the output of the comparison circuit 242, as the pulse Wn, and the NAND circuit 258 outputs a negative logical product of an inverted signal of the output of the comparison circuit 242 from the inverter 254 and the output of the comparison circuit 244, as the pulse Wp.

The output buffer circuit 26 includes inverters 262 and 264. Each of the inverters 262 and 264 includes a P-channel transistor and an N-channel transistor interposed in series between a power source +VB and a ground. The inverter 262 inverts the level of the pulse Wn supplied from the PWM circuit 24 so as to generate the output signal Qn, and the inverter 264 inverts the level of the pulse Wp supplied from the PWM circuit 24 so as to generate the output signal Qp.

The first attenuator 30 of FIG. 1 is interposed between the input path 16a extending the input end 12p to the input end 13p of the amplifier 20 and the input path 16b extending from the input end 12n to the input end 13n of the amplifier 20. The first attenuator 30 attenuates the levels of the input signals S (Sp and Sn) (that is, the first attenuator 30 is a means for performing soft clipping on the input signals S) such that the attenuation rate increases as the absolute values of the levels of the input signals S increases in the range in which the absolute values of the levels of the input signals are higher than a predetermined value, and includes a transistor TR1 and a voltage applying circuit 32 as shown in FIG. 1.

The transistor TR1 is an N-channel field-effect transistor (MOSFET) interposed between the input paths 16a and 16b. In other words, an electrode e1 (one of the source and drain) of the transistor TR1 is connected to a connection node of the resistors Ra1 and Ra2 on the input path 16a, and an electrode e2 (the other of the source and drain) of the transistor TR1 is connected to a connection node of the resistors Rb1 and Rb2 on the input path 16b.

Figure 2:
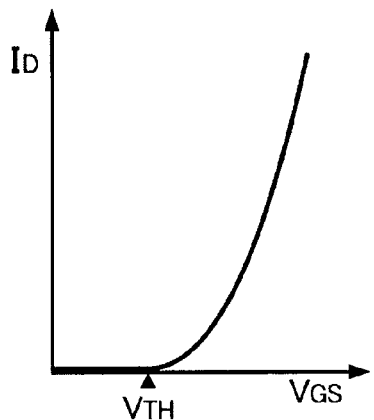
FIG. 2 is a graph illustrating an electric characteristic of a transistor of a first attenuator of the class-D amplifier circuit.

FIG. 2 is a graph illustrating an electric characteristic of the transistor TR1. In FIG. 2, a horizontal axis indicates a gate-source voltage VGS of the transistor TR1, and a vertical axis indicates a current (drain-source current) ID flowing between the electrode e1 and electrode e2 of the transistor TR1. As shown in FIG. 2, the transistor TR1 maintains an OFF state (ID=0) when the voltage VGS is lower than a threshold voltage VTH, and transitions to an ON state when the voltage VGS exceeds the threshold voltage VTH such that the resistance decreases and the current ID corresponding to the square of the voltage VGS flows.

The voltage applying circuit 32 of FIG. 1 applies a control voltage VC to a gate (control terminal) of the transistor TR1. The voltage applying circuit 32 illustrated in FIG. 1 includes a transistor TR2, a current source 322, and a voltage source 324. The transistor TR2 is an N-channel field-effect transistor which has drive capability (sizes such as a channel width and a channel length) and electric characteristics such as the threshold voltage VTH which are substantially the same as those of the transistor TR1.

The current source 322 generates a predetermined current I0 (for example, I0=1 µA), and the voltage source 324 generates a predetermined reference voltage VREF. The transistor TR2 is interposed, with a state that a gate thereof is connected to one of a source and a drain thereof (that is, diode connection state), between the current source 322 and the voltage source 324. Therefore, the control voltage VC higher than the reference voltage VREF by the threshold voltage VTH of the transistor TR2 is applied to the gate of the transistor TR1.

Figure 3:
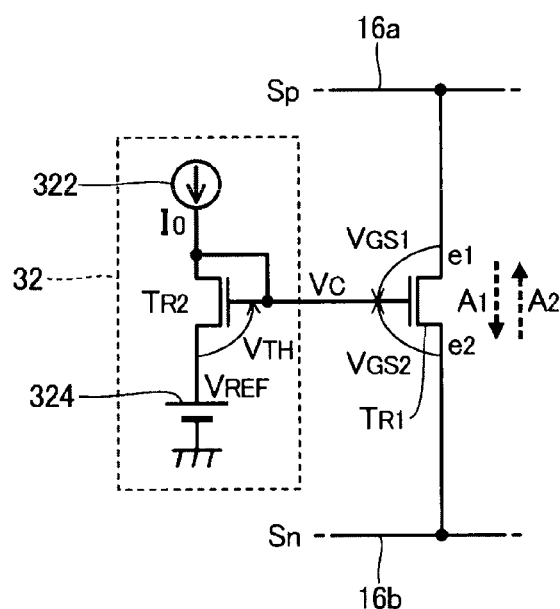
FIG. 3 is an explanatory view of an operation of the first attenuator.

FIG. 3 is an explanatory view of an operation of the first attenuator 30. A voltage VGS1 of FIG. 3 means a voltage (gate-source voltage VGS) between the gate and electrode e1 of the transistor TR1, and a voltage VGS2 of FIG. 3 means a voltage (gate-source voltage VGS) between the gate and electrode e2 of the transistor TR1.

In a case where the levels of the input signals S (Sp and Sn) change within a range in which both of the voltages VGS1 and VGS2 are lower than the threshold voltage VTH (that is, a case where the absolute values of the levels of the input signals are lower than the reference voltage VREF), the transistor TR1 maintains the OFF state. In other words, in a case where the levels of the input signals S change within an appropriate range, attenuation of the input signals Sp and Sn by the first attenuator 30 stops.

Meanwhile, in a case where the voltage of the input signal Sn decreases as the voltage VGS2 between the gate and electrode e2 of the transistor TR1 increases from the threshold voltage VTH of the transistor TR1 (that is, a case where the absolute values of the levels of the input signals S are higher than the reference voltage VREF), the transistor TR1 transitions to the ON state. As described above, if the transistor TR1 transitions to the ON state due to the decrease in the input signal Sn, the current ID flows from the input path 16a to the input path 16b through the electrodes e1 and e2 of the transistor TR1, as shown by an arrow A1 in FIG. 3. Therefore, the level of the input signal Sn increases and the level of the input signal Sp deceases. In other words, attenuation (soft clipping) of the input signals S is performed.

Even in a case where the voltage of the input signal Sp decreases as the voltage VGS1 between the gate and electrode e1 of the transistor TR1 increases from the threshold voltage VTH of the transistor TR1, similarly, the transistor TR1 transitions to the ON state. Therefore, the current ID flows from the input path 16b to the input path 16a through the electrodes e2 and e1 of the transistor TR1, as shown by an arrow A2 in FIG. 3, such that the level of the input signal Sp increases and the level of the input signal Sn deceases. In other words, attenuation (soft clipping) of the input signals S is performed.

Figure 4:
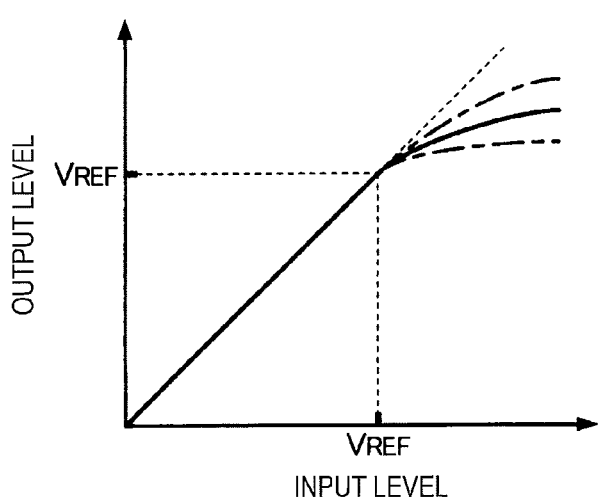
FIG. 4 is a graph illustrating levels of an input signal before and after action of the first attenuator.

FIG. 4 is a graph illustrating a relation between the absolute values (hereinafter, referred to as 'input levels') of the levels of the input signals S when the input signals S are supplied to the input ends 12*p* and 12*n*, respectively, and the absolute values (hereinafter, referred to as 'output levels') of the levels of the input signals S when the input signals S are input to the amplifier 20 (error integrator 22). In FIG. 4, for convenience, only the action of the first attenuator 30 is focused on, and the actions of the second attenuator 40 and the amplifier 20 are ignored.

Since the current ID increases as the voltage VGS (VGS1 or VGS2) increases, as shown in FIG. 4, the attenuation rate of the input signals Sp and Sn (the degree of decrease in the output levels with respect to the input levels) increases as the input levels increase within a range in which the input levels are higher than the reference voltage VREF. In other words, as the input levels increase within a range in which the input levels are higher than the reference voltage VREF, the gains of the input signals S continuously decreases. As shown by a dotted line in FIG. 4, the relation between the input levels and the output levels in the range in which the input levels are higher than the reference voltage VREF changes according to the electric characteristics (the drive capability and the threshold voltage VTH) of the transistor TR1. The reference voltage VREF which the voltage source 324 generates is set to an appropriate voltage such that clipping does not occur on the output signals Qp and Qn. In the first attenuator 30, since the resistance (current ID) between both ends of the transistor TR1 changes according to the levels of the input signals S, in a case where the levels of the input signals S decrease, it is possible to increase the resistance (to decrease the current ID) between both ends of the transistor TR1, thereby quickly stopping the attenuation of the input signals S.

The second attenuator 40 of FIG. 1 attenuates the input signals S (Sp and Sn), like the first attenuator 30. Specifically, the second attenuator 40 includes a switch 42 interposed in parallel with the transistor TR1 of the first attenuator 30 between the input paths 16*a* and 16*b*. The switch 42 is composed of, for example, a field-effect transistor.

The control circuit 45 controls the switch 42 between an ON state and an OFF state. If the switch 42 is controlled such that the switch 42 becomes the ON state, the input paths 16*a* and 16*b* are connected to each other and thus the input signals S are attenuated. Specifically, the control circuit 45 controls the switch 42 intermittently at sufficiently short intervals, as compared to the triangular-wave signal STR, such that the switch 42 becomes the ON state (is repeatedly switched between the ON state and the OFF state), so as to attenuate the input signals S.

As shown in FIG. 1, the control circuit 45 includes a clipping detector 452 and a control-signal generator 454. The clipping detector 452 detects occurrence of clipping on the output signals Qp and Qn or a condition close to the occurrence of clipping (hereinafter, referred to generally as 'occurrence of clipping'). Specifically, the clipping detector 452 compares the levels of the integrated-value signals Up and Un generated by the error integrator 22 with a predetermined reference value, and detects occurrence of clipping in a case where the level of at least one of the integrated-value signals Up and Un is higher than the reference value. In a case where the clipping detector 452 detects the occurrence of clipping, the control-signal generator 454 generates a control signal CTL to control the switch 42 such that the switch 42 becomes the ON state periodically and intermittently. Since the input signals S are attenuated by supply of the control signal CTL, the clipping of the output signals Qp and Qn is eliminated or prevented.

Figure 5:
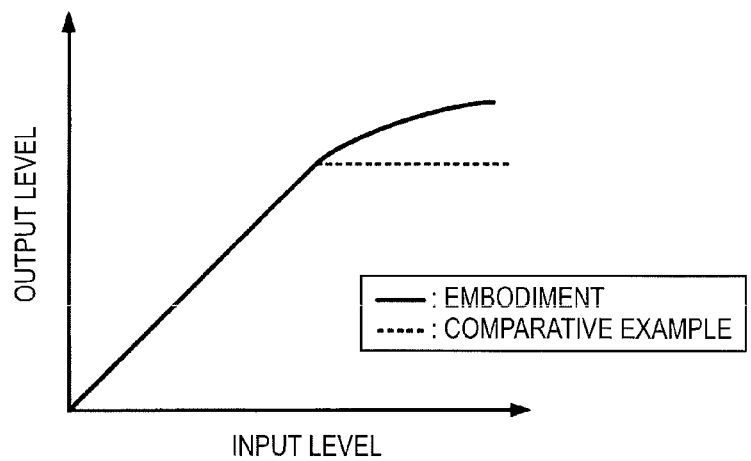
FIG. 5 is a graph illustrating levels of the input signal before and after action of a second attenuator.
Figure 6:
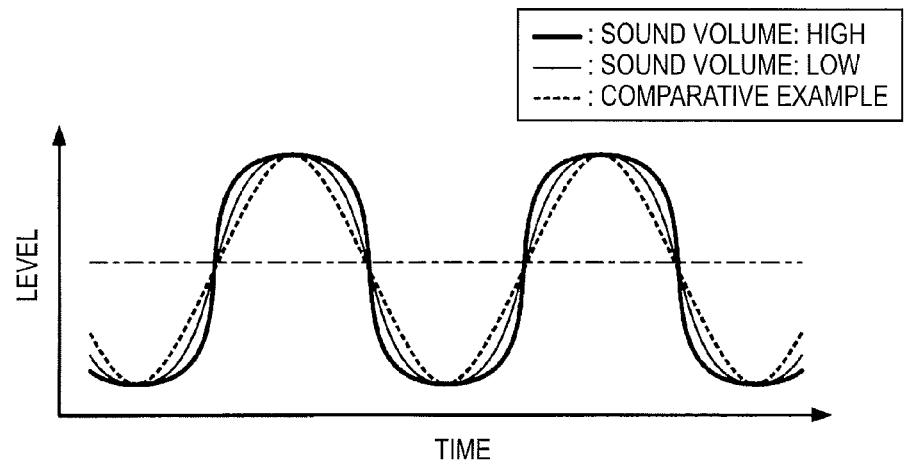
FIG. 6 is a waveform chart of a voltage between both ends of a drive load.

FIG. 5 is a graph illustrating a relation between the input levels and the output levels. In FIG. 5, for convenience, the action of the amplifier 20 is ignored. A characteristic of the embodiment in which both of the first attenuator 30 and the second attenuator 40 operate is shown by a solid line, and a characteristic of a configuration (hereinafter, referred to as a 'comparative example') in which the first attenuator 30 is omitted and only the second attenuator 40 operates is shown by a broken line. FIG. 6 is a waveform chart of a voltage between both ends of a drive load (not shown) such as a speaker in a case where the drive load is connected to the output ends 14*p* and 14*n* of the class-D amplifier circuit 100 through a low pass filter. In FIG. 6, for convenience, a case where the input signals are sinusoidal is assumed, and the characteristic of the comparative example is shown by a broken line.

As understood from FIG. 5, in the comparative example, in the range in which the input levels are higher than a predetermined value, even if the input levels increase, the output levels are fixed constantly. Therefore, as shown by the broken line in FIG. 6, during the operation of the second attenuator 40, even when the input levels change (for example, a case where a user raises the sound volume), the output levels do not change. Meanwhile, in the embodiment, since the attenuation rate by the first attenuator 30 continuously changes according to the input levels, as shown in FIG. 5, even when the input levels change in the range in which the input levels are higher than the predetermined value (that is, a range in which the first attenuator 30 or the second attenuator 40 operates), the output levels change. Therefore, in the embodiment, the output levels in a case where the input levels increase in the range in which the input levels are higher than the predetermined value (Sound volume: High) are different from the output levels in a case where the input levels decrease in the range in which the input levels are higher than the predetermined value (Sound volume: Low). In other words, even when the input signals S are attenuated (the first attenuator 30 operates) it is possible to change the sound volume. Therefore, according to the embodiment, it is possible to implement sufficient sound volume feeling, as compared to the comparative example.

MODIFICATION(S)

The above-mentioned embodiment may be variously modified. Specific modifications are as follow. Two or more arbitrarily selected from the following modifications can be appropriately combined.

First, in the above-mentioned embodiment, the current source 322 of the first attenuator 30 operates regardless of occurrence and nonoccurrence of clipping on the output signals Q (Qp and Qn). However, in a case where the occurrence of clipping is detected (that is, the second attenuator 40 operates), the current source 322 may generate the current I0, and in a case where the occurrence of clipping is not detected, the current source 322 may stop generation of the current I0. According to this configuration, it is possible to reduce the power consumption, as compared to a configuration in which the current source 322 steadily operates.

Figure 11:
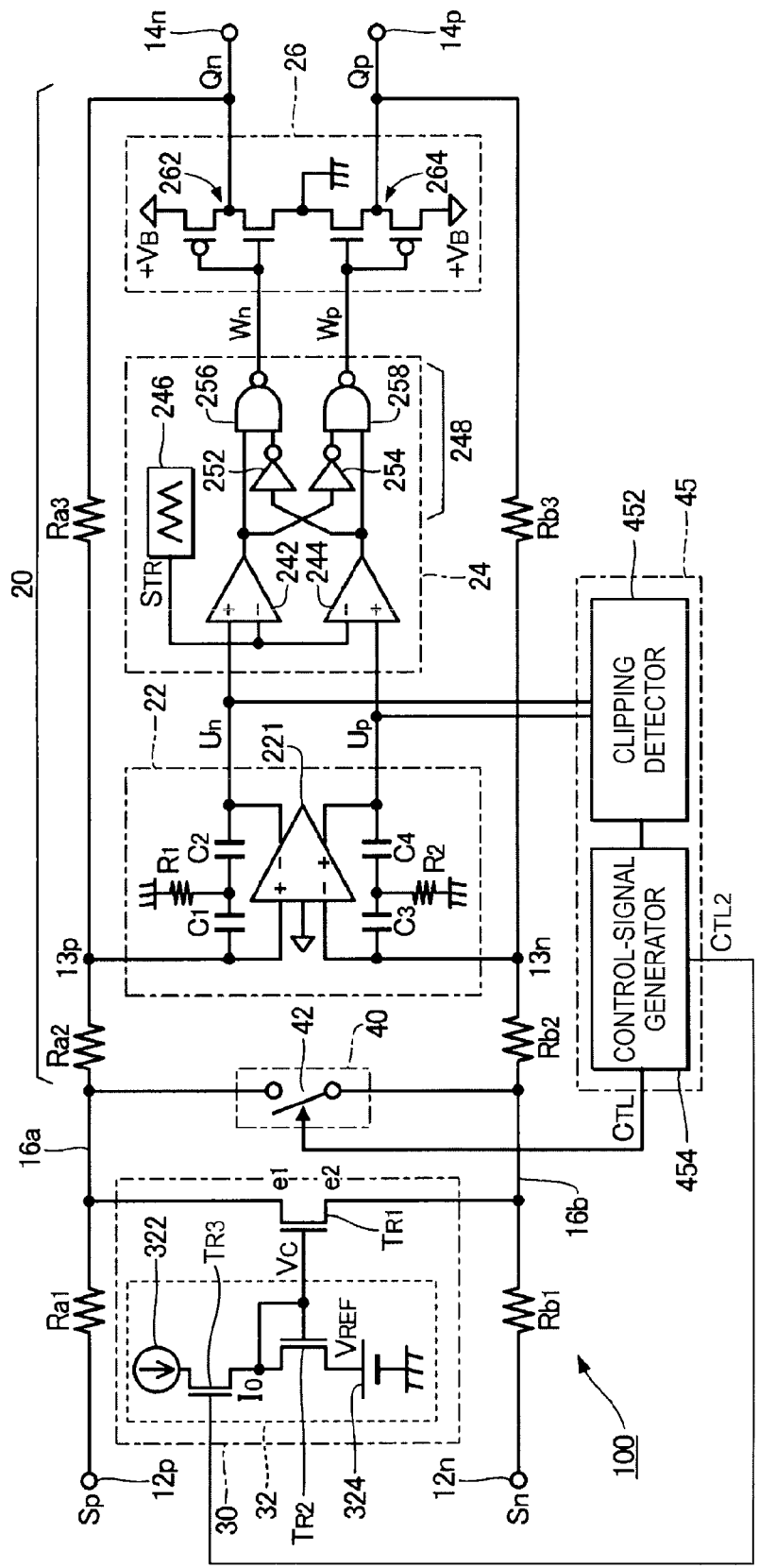
FIG. 11 is a circuit diagram of a class-D amplifier circuit according to other modification.

In the above case, more specifically, the voltage applying circuit 32 further includes a transistor TR3 for controlling generation of a current of the current source 322 as shown in FIG. 11. In a case where the occurrence of clipping is detected by the clipping detector 452, the control-signal generator 454 generates a control signal CTL2 and supplies the control signal CTL2 to a gate of the transistor TR3 so as to control the transistor TR3 to turn on. The current source 322 generates the current based on supply of the control signal CTL2. On the other hand, in a case where the occurrence of clipping is not detected by the clipping detector 452, the control-signal generator 454 generates a control signal CTL2 and supplies the control signal CTL2 to the gate of the transistor TR3 so as to control the transistor TR3 to turn off. The current source 322 does not generate the current based on supply of the control signal CTL2. Therefore, power consumption is reduced, as compared to a case where the current source steadily generates a current.

Figure 7:
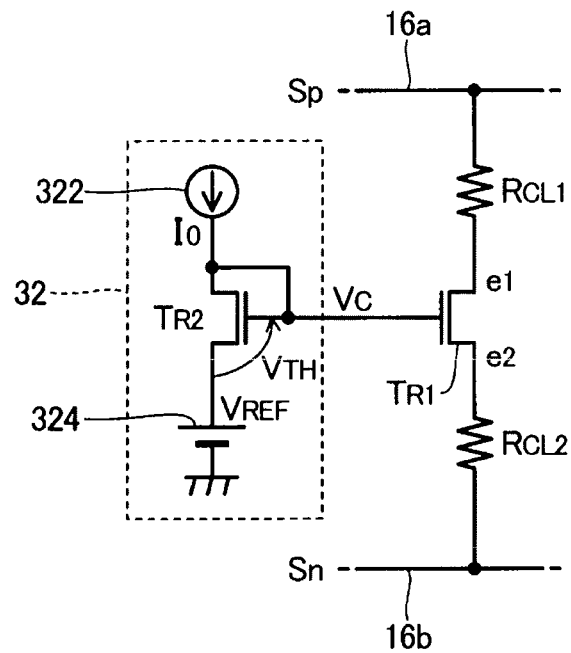
FIG. 7 is a circuit diagram of a first attenuator according to a modification.
Figure 8:
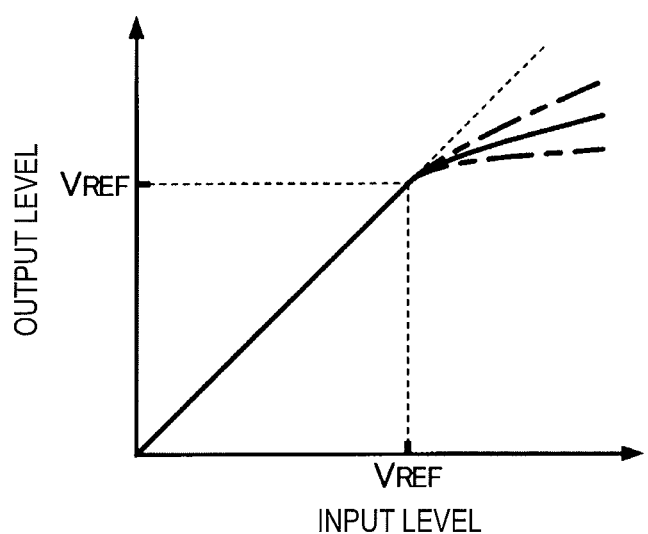
FIG. 8 is a graph illustrating levels of an input signal before and after action of the first attenuator according to the modification.

Second, as shown in FIG. 7, resistors RCL1 and RCL2 may be added to the transistor TR1 of the first attenuator 30. The resistor RCL1 may be interposed between the input path 16*a* and the electrode e1 of the transistor TR1, and the resistor RCL2 may be interposed between the input path 16*b* and the electrode e2 of the transistor TR1. According to the configuration of FIG. 7, since influence of the resistor RCL1 or RCL2 (fixed value) on the ON resistance of the transistor TR1 increases, as shown in FIG. 8, the relation between the input levels and the output levels during the operation of the first attenuator 30 approaches to a straight line. As shown by a dotted line in FIG. 8, it is possible to appropriately select the resistance value of the resistor RCL1 or RCL2 of FIG. 7, so as to adjust the relation between the input levels and the output levels.

Figure 9:
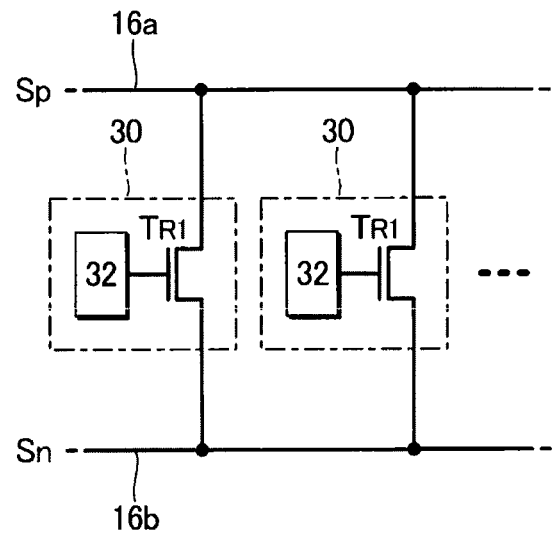
FIG. 9 is a partial circuit diagram of a class-D amplifier circuit according to a modification.

Third, as shown in FIG. 9, a plurality of first attenuators 30 may be disposed in parallel. The electric characteristics (the drive capability and the threshold voltage VTH) of the transistor TR1 and the control voltage VC are different for each first attenuator 30. Therefore, the input levels at which each first attenuator 30 starts an operation, and a characteristic of a change in the resistance of the transistor TR1 with respect to the input levels are different for each first attenuator 30. Also, in a configuration obtained by adding the resistors RCL1 and RCL2 of FIG. 7 to the transistor TR1 of each first attenuator 30, the resistance values of the resistors RCL1 and RCL2 are different for each first attenuator 30. According to the configuration of FIG. 9, it is possible to adjust the relation between the input levels and the output levels to multiple levels according to the input levels.

Fourth, the control voltage VC which is supplied to the gate of the transistor TR1 may be appropriately selected according to a need for control of clipping of the output signals Q. For example, the control voltage VC (reference voltage VREF) may be set such that the first attenuator 30 starts operating when the input levels reach a level operating the second attenuator 40 (a level at which clipping of the output signals Q occurs).

Figure 10:
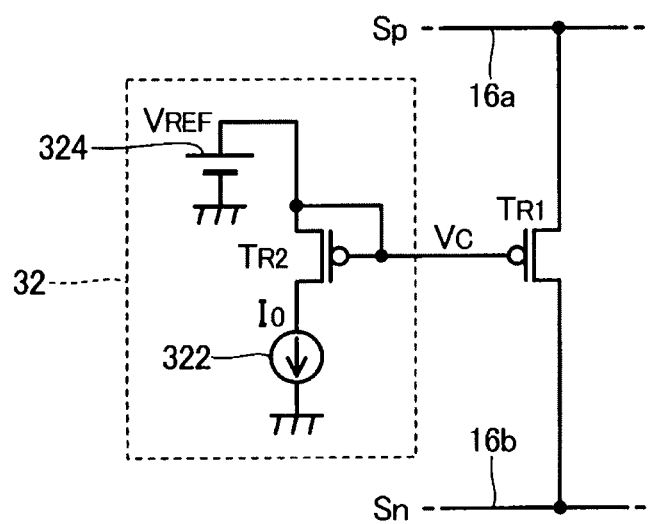
FIG. 10 is a circuit diagram of a first attenuator according to another modification.

Fifth, the transistors TR1 and TR2 of the first attenuator 30 may be a P-channel type, as shown in FIG. 10. Further, in the above-mentioned embodiment, the electric characteristics (the drive capability and the threshold voltage VTH) are the same for the transistors TR1 and TR2. However, the electric characteristics may be different for the transistors TR1 and TR2 of FIG. 3 or 10. Furthermore, bipolar transistors having bases as control terminals may be used as the transistors TR1 and TR2 of FIG. 3 or 10.

Sixth, in the above-mentioned embodiment, the clipping detector 452 detects occurrence of clipping according to the integrated-value signals Up and Un. However, a method of detecting occurrence of clipping of the output signals Q (including that it is time close to occurrence of clipping) is arbitrary. For example, considering that virtual short-circuit is not established in the operational amplifier 221 of the error integrator 22 in a case clipping on the output signals Q occurs, occurrence of clipping may be detected in a case where the voltage between both input ends of the operational amplifier 221 is higher than a predetermined value (that is, a case where the virtual short circuit is not established)

Here, the details of the above embodiment are summarized as follows. A class-D amplifier circuit includes an amplifier (for example, an amplifier 20) for generating pulse-width modulated output signals according to input signals which have phases reverse to each other and are supplied to a first input end and a second input end, a first transistor (for example, a transistor TR1) interposed between a first input path (for example, an input path 16*a*) extending from the first input end to the amplifier and a second input path (for example, an input path 16*b*) extending from a second input end to the amplifier, and a voltage applying circuit (for example, a voltage applying circuit 32) for applying a control voltage corresponding to a predetermined value to a control terminal of the first transistor so that a current flowing between both ends of the first transistor increases in accordance with increase of the levels of the input signals (typically, the absolute values of the levels of the input signals) within a range in which the levels of the input signals are higher than the predetermined value.

In this configuration, as the absolute values of the levels of the input signals increase within the range in which the absolute values of the levels of the input signals are higher than the predetermined value, the current flowing between both ends of the first transistor increases (that is, an attenuation rate of the input signals increases). Therefore, even when the input signals are attenuated, it is possible to change the sound volume. Further, since resistance (current) between both ends of the first transistor changes according to the levels of the input signals, even if the levels of the input signals decreases, it is possible to quickly stop the attenuation of the input signals by the first transistor.

The voltage applying circuit may include a current source (for example, a current source 322) for generating a current, a voltage source (for example, a voltage source 324) for generating a reference voltage, and a second transistor (for example, a transistor TR2) that is interposed between the current source and the voltage source in a diode connection state, and has a control terminal connected to the control terminal of the first transistor. According to this configuration, it is possible to appropriately set the levels of the input signals at which the first transistor is turned on or off, according to the reference voltage of the voltage source.

Further, the current source may generate the current if occurrence of clipping of the output signals of the amplifier (actual occurrence of clipping or that it is time close to occurrence of clipping) is detected, and stops generation of the current if occurrence of clipping is not detected. According to this configuration, if the occurrence of the clipping is not detected, the current generation of the current source stops. Therefore, power consumption is reduced, as compared to a case where the current source steadily generates a current.

The class-D amplifier circuit may further include a switch (for example, a switch 42) disposed between the first input path and the second input path so as to be in parallel with the first transistor, and a control circuit (for example, a control circuit 45) for controlling the switch such that the switch is turned on intermittently so as to attenuate the input signals if occurrence of clipping of the output signal of the amplifier (actual occurrence of clipping or that it is time close to occurrence of clipping) is detected. According to this configuration, in addition to attenuation of the input signals by the first transistor, attenuation of the input signals by control on the switch is performed. Therefore, it is possible to highly prevent clipping of the output signals.

The class-D amplifier circuit may further includes a first resistor (for example, a resistor RCL1) interposed between the first input path and the first transistor, and a second resistor (for example, a resistor RCL2) interposed between the second input path and the first transistor. According to this configuration, it is possible to adjust a relation between the unattenuated levels and attenuated levels of the input signals according to the resistance values of the first resistor and the second resistor.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japanese Patent Application No. 2010-284721 filed on Dec. 21, 2010, the contents of which are incorporated herein by reference.

What is claimed is:

1. A class-D amplifier circuit comprising:
   an amplifier that generates pulse-width modulated output signals according to input signals which have phases reverse to each other and are supplied to a first input end and a second input end;
   a first transistor interposed between a first input path extending from the first input end to the amplifier and a second input path extending from the second input end to the amplifier; and
   a voltage applying circuit that applies a control voltage corresponding to a predetermined value to a control terminal of the first transistor so that a current flowing between both ends of the first transistor increases in accordance with increase of levels of the input signals within a range in which the levels of the input signals are higher than the predetermined value.

2. The class-D amplifier circuit according to claim 1, wherein the voltage applying circuit includes:
   a current source which generates a current;
   a voltage source which generates a reference voltage; and
   a second transistor which is interposed in a diode connection state between the current source and the voltage source, and has a control terminal connected to the control terminal of the first transistor.

3. The class-D amplifier circuit according to claim 2, wherein the current source generates the current if occurrence of clipping of the output signals of the amplifier is detected, and stops generation of the current if the occurrence of clipping is not detected.

4. The class-D amplifier circuit according to claim 1, further comprising:
   a switch disposed in parallel with the first transistor and disposed between the first input path and the second input path; and
   a control circuit that controls the switch so that the switch is turned on intermittently so as to attenuate the input signals if occurrence of clipping of the output signal of the amplifier is detected.

5. The class-D amplifier circuit according to claim 1, further comprising:
   a first resistor interposed between the first input path and the first transistor; and
   a second resistor interposed between the second input path and the first transistor.

\* \* \* \* \*